(12) United States Patent
Yu et al.

(10) Patent No.: US 12,355,167 B2
(45) Date of Patent: Jul. 8, 2025

(54) CONNECTION DESIGNS FOR MEMORY SYSTEMS

(71) Applicant: Micron Technology, Inc., Boise, ID (US)

(72) Inventors: Wei Yu, Singapore (SG); Ling Pan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 473 days.

(21) Appl. No.: 17/815,917

(22) Filed: Jul. 28, 2022

(65) Prior Publication Data
US 2024/0039185 A1 Feb. 1, 2024

(51) Int. Cl.
*H01R 12/52* (2011.01)
*H01R 12/71* (2011.01)
*H01R 12/73* (2011.01)

(52) U.S. Cl.
CPC ........ *H01R 12/523* (2013.01); *H01R 12/718* (2013.01); *H01R 12/737* (2013.01)

(58) Field of Classification Search
CPC ........ H01R 13/11; H01R 13/15; H01R 13/17; H01R 13/18; H01R 13/187; H01R 13/193; H01R 13/2407; H01R 13/2414; H01R 13/2421; H01R 13/2428; H01R 13/2457; H01R 13/33; H01R 13/62933; H01R 13/62938; H01R 13/62944; H01R 13/62966; H01R 13/635; H01R 13/639; H01R 13/6271; H01R 13/6272; H01R 13/6273; H01R 13/6275; H01R 12/523; H01R 12/7011; H01R 12/7076; H01R 12/716; H01R 12/718; H01R 12/712; H01R 12/71; H01R 13/62
See application file for complete search history.

(56) References Cited

U.S. PATENT DOCUMENTS

| | | | | |
|---|---|---|---|---|
| 5,702,255 A | * | 12/1997 | Murphy | H05K 7/1061 439/74 |
| 5,877,554 A | * | 3/1999 | Murphy | G01R 1/0483 257/727 |
| 6,344,684 B1 | * | 2/2002 | Hussain | H01L 23/50 257/E23.079 |
| 6,464,513 B1 | * | 10/2002 | Momenpour | H01R 13/22 257/726 |
| 7,118,385 B1 | * | 10/2006 | Bodenweber | H05K 7/1061 439/71 |

(Continued)

*Primary Examiner* — Harshad C Patel
(74) *Attorney, Agent, or Firm* — Holland & Hart LLP

(57) ABSTRACT

Methods, systems, and devices for connection designs for memory systems are described. A memory system may include a package and a printed circuit board (PCB). An interface of the package may be coupled with the PCB via a set of springs, where each spring may include a material configured to deform based at least in part on a shape of the package, a shape of the PCB, or both. The memory system may also include a set of latches that may secure the package in a fixed position relative to the PCB. That is, the set of springs may provide an electrical connection between the package and the PCB, and the set of latches may provide a mechanical connection between the package and the PCB. In some examples, the package, the PCB, or both, may include one or more connection structures configured to receive the latches.

17 Claims, 7 Drawing Sheets

(56) References Cited

U.S. PATENT DOCUMENTS

| | | | | |
|---|---|---|---|---|
| 7,140,884 B2* | 11/2006 | Brodsky | H01R 13/2421 | 439/700 |
| 7,189,094 B2* | 3/2007 | Ma | H01R 12/88 | 439/73 |
| 7,214,082 B2* | 5/2007 | Hashiguchi | H01R 13/18 | 439/263 |
| 7,220,134 B2* | 5/2007 | Goodman | H05K 7/1061 | 439/70 |
| 7,247,043 B2* | 7/2007 | Lai | H05K 7/1053 | 439/331 |
| 7,278,859 B1* | 10/2007 | Irvine | H01R 12/7076 | 439/71 |
| 7,329,146 B2* | 2/2008 | Yang | H01R 12/7029 | 439/570 |
| 7,435,102 B2* | 10/2008 | Goodman | H01R 13/2421 | 439/70 |
| 7,442,044 B2* | 10/2008 | Yang | G06K 7/0021 | 439/328 |
| 7,442,087 B2* | 10/2008 | Long | G06K 7/0021 | 439/377 |
| 7,510,444 B2* | 3/2009 | Chang | H01R 13/2442 | 439/862 |
| 7,549,870 B2* | 6/2009 | Mason | H01R 13/2414 | 439/91 |
| 7,568,958 B2* | 8/2009 | Vigier | H01M 50/566 | 439/876 |
| 7,575,449 B1* | 8/2009 | Cai | H05K 7/1053 | 439/135 |
| 7,625,219 B2* | 12/2009 | Osato | H01R 12/88 | 439/71 |
| 7,690,925 B2* | 4/2010 | Goodman | H01R 13/2421 | 439/70 |
| 7,802,997 B2* | 9/2010 | Kuo | H01R 13/502 | 361/737 |
| 7,871,274 B2* | 1/2011 | Chiang | H05K 1/141 | 439/700 |
| 7,874,880 B2* | 1/2011 | Fedde | H01R 13/2471 | 439/841 |
| 8,079,876 B2* | 12/2011 | Wang | H01R 13/2442 | 439/862 |
| 8,133,061 B1* | 3/2012 | Ayers, Sr. | H01R 12/714 | 439/66 |
| 8,587,947 B2* | 11/2013 | Yonemochi | H01L 23/4093 | 439/70 |
| 10,577,713 B2* | 3/2020 | Miyamoto | C25D 17/004 | |
| 2007/0290338 A1* | 12/2007 | Kuczynski | H01L 23/26 | 257/E23.137 |
| 2018/0184517 A1* | 6/2018 | Cantin | H05K 1/0251 | |

* cited by examiner

CONNECTION DESIGNS FOR MEMORY SYSTEMS

FIELD OF TECHNOLOGY

The following relates to one or more systems for memory, including connection designs for memory systems.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

A memory system may include one or more components, such as a package (e.g., a die package) and a printed circuit board (PCB). The package may include one or more memory devices. The PCB may include a controller configured to perform memory operations (e.g., access operations) at the memory devices. The memory devices may be coupled with the controller of the PCB via an interface (e.g., one or more through-silicon vias (TSVs)) at the package. In some cases, a set of solder balls may provide a mechanical connection and an electrical connection between the package and the PCB. However, reflow processes to attach the solder balls to the package and the PCB may include one or more thermal cycles that heat the memory system to a temperature at which the solder material is liquid (e.g., 220° C.-260° C.), which may reduce reliability of the memory system, for example, by introducing cracks in the solder joints or warping the package or the PCB.

As described herein, a memory system may include a connection system without solder balls, which may improve reliability of the memory system. For example, an interface of a package may be coupled with a PCB via a set of springs, where each spring may include a material configured to deform based at least in part on a shape of the package, a shape of the PCB, or both. The memory system may also include a set of latches that may secure the package in a fixed position relative to the PCB. That is, the set of springs may provide an electrical connection between the package and the PCB, and the set of latches may provide a mechanical connection between the package and the PCB. In some examples, the package, the PCB, or both, may include one or more connection structures configured to receive the latches.

Features of the disclosure are initially described in the context of systems and dies as described with reference to FIGS. 1 and 2. Features of the disclosure are described in the context of memory systems as described with reference to FIGS. 3, 4A, 4B, and 5A-5C. These and other features of the disclosure are further illustrated by and described with reference to an apparatus diagram and flowcharts that relate to connection designs for memory systems as described with reference to FIGS. 6 and 7.

Figure 1:
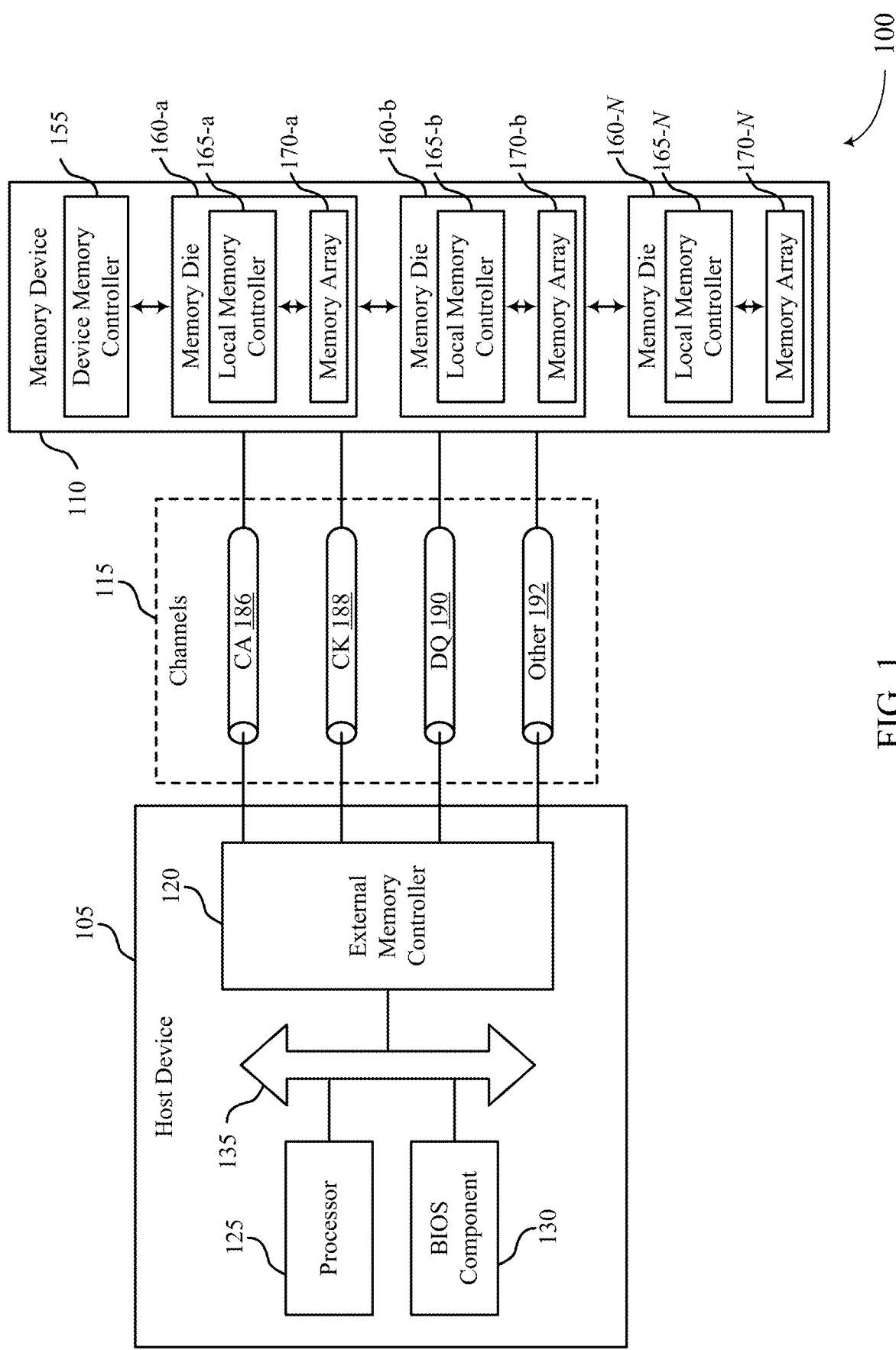
FIG. 1 illustrates an example of a system that supports connection designs for memory systems in accordance with examples as disclosed herein.

FIG. 1 illustrates an example of a system 100 that supports connection designs for memory systems in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. Each memory cell may include a capacitive storage element (e.g., a dynamic RAM (DRAM) memory cell). A memory device 110 including two or more memory dies 160 may be referred to as a multi-die memory or a multi-die package or a multi-chip memory or a multi-chip package. Although described in the context of DRAM memory cells, a memory array 170 may include other types of memory cells such as static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory.

A memory die 160 may be an example of a two-dimensional (2D) array of memory cells or may be an example of a three-dimensional (3D) array of memory cells. In some examples, a 2D memory die 160 may include a single memory array 170. In some examples, a 3D memory die 160 may include two or more memory arrays 170, which may be stacked on top of one another or positioned next to one another (e.g., relative to a substrate). In some examples, memory arrays 170 in a 3D memory die 160 may be referred to as or otherwise include different sets (e.g., decks, levels, layers, dies). A 3D memory die 160 may include any quantity of stacked memory arrays 170 (e.g., two high, three high, four high, five high, six high, seven high, eight high). In some 3D memory dies 160, different decks may share a common access line such that some decks may share one or more of a word line, a digit line, or a plate line.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

As described herein, the system 100 may include a connection system without solder balls, which may improve reliability of the system 100. For example, the memory device 110 may be included in a package, such as a die package, and the host device 105 may be included in a PCB. Additionally, or alternatively, the memory device 110 may include the package and the PCB, where the PCB may include the device memory controller 155, and the package may include the memory dies 160. An interface of the package may be coupled with the PCB via a set of springs, where each spring may include a material configured to deform based at least in part on a shape of the package, a shape of the PCB, or both. The springs may be configured to deform at temperatures lower than solder balls. Using springs, warping or other issues related to heating the memory system during a reflow process may be reduced, as compared with using solder balls. The system 100 may also include a set of latches that may secure the package in a fixed position relative to the PCB. That is, the set of springs may provide an electrical connection between the package and the PCB, and the set of latches may provide a mechanical connection between the package and the PCB. In some examples, the package, the PCB, or both, may include one or more connection structures configured to receive the latches.

Figure 2:
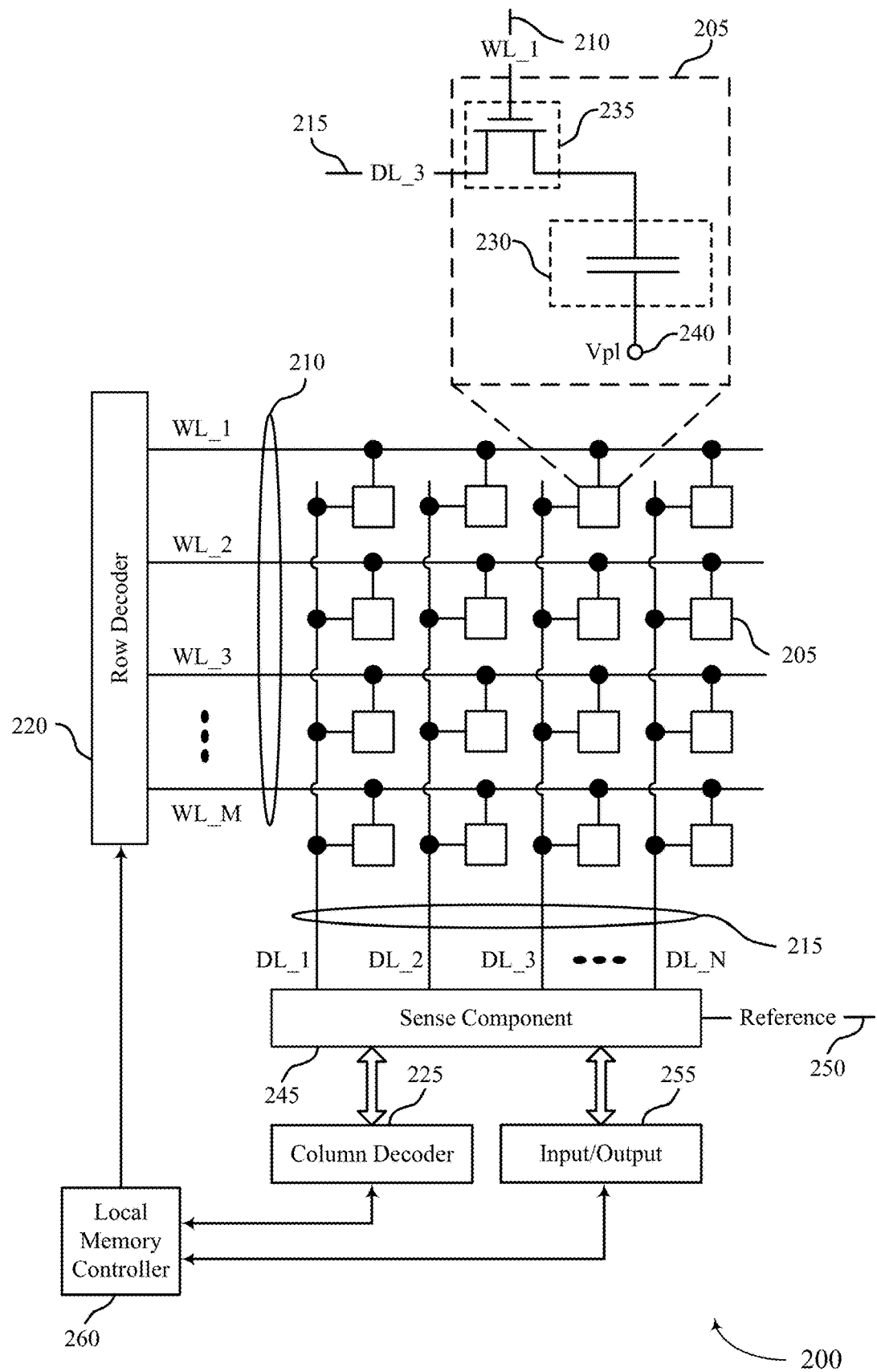
FIG. 2 illustrates an example of a memory die that supports connection designs for memory systems in accordance with examples as disclosed herein.

FIG. 2 illustrates an example of a memory die 200 that supports connection designs for memory systems in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

As described herein, a system including the memory die 200 may include a connection system without solder balls, which may improve reliability of the system. For example, the memory die 200 may be included in a package, such as a die package, that is coupled with a PCB. An interface of the package may be coupled with the PCB via a set of springs, where each spring may include a material configured to deform based at least in part on a shape of the package, a shape of the PCB, or both. The connection system may also include a set of latches that may secure the package in a fixed position relative to the PCB. That is, the set of springs may provide an electrical connection between the package and the PCB, and the set of latches may provide a mechanical connection between the package and the PCB. In some examples, the package, the PCB, or both, may include one or more connection structures configured to receive the latches.

Figure 3:
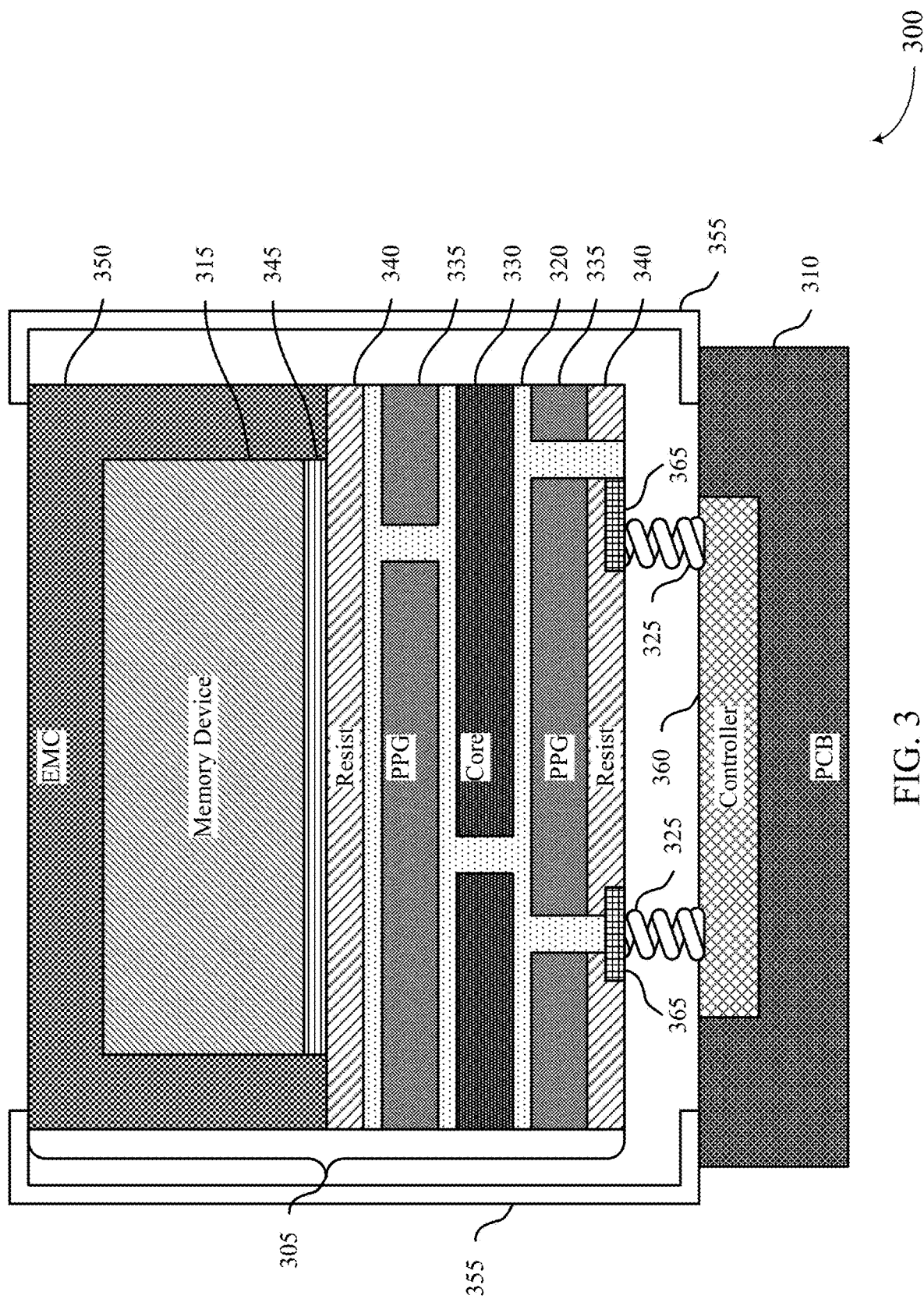
FIG. 3 illustrates an example of a memory system that supports connection designs for memory systems in accordance with examples as disclosed herein.

FIG. 3 illustrates an example of a memory system 300 that supports connection designs for memory systems in accordance with examples as disclosed herein. In some examples, the memory system 300 may include one or more aspects of the system 100 as described with reference to FIG. 1.

The memory system 300 may include a package 305 and a PCB 310. The package 305 may include a memory device 315, which may include or be an example of one or more memory dies as described with reference to FIGS. 1 and 2. In some examples, the package 305 may further include one or more components for enabling memory operations. For example, the package 305 may include an interface 320 (e.g., a set of TSVs) for communications between a core 330 and the memory device 315. The core 330 may include a processor, a device memory controller, a local memory controller, or any combination thereof. The package 305 may further include one or more layers supporting the components of the package 305, including one or more layers of prepreg (PPG) 335, one or more layers of resist 340, one or more layers of die attach film (DAF) 345, one or more layers of epoxy molding compound (EMC) 350, or any combination thereof. The PPG 335 may include fibers (e.g., glass fibers) in a resin, and the layers of PPG 335 may bond the components of the package 305 together. The resist 340 may be a solder resist. The DAF 345 may be an adhesive to connect the components of the package 305. The EMC 350 may cover and protect the components of the package 305.

In some examples, the memory device 315 may communicate with a controller 360 (e.g., a device memory controller or an external memory controller of a host device) of the PCB 310 via the interface 320. The interface 320 may be coupled with the controller 360 via a set of springs 325, where each spring 325 may configured to deform (e.g., at lower temperatures than used during a reflow process) based on a shape of the package 305, a shape of the PCB 310, a deformation of the package 305, a deformation of the PCB 310, or any combination thereof. Each spring 325 may include a material (e.g., copper, silver, tin, another conductive material, or any combination thereof), where the material may be selected based on a conductivity of the material, a contact resistance of the material, a thermal range associated with operating the memory device 315, or any combination thereof. In some examples, the interface 320 may include a set of metal pads 365, where each metal pad 365 may be coupled with a spring 325. In some examples, a size of each spring 325 (e.g., a length, a width, or both) may be based on a size of the metal pads 365. In some examples, each spring 325 may have rectangular shape, a cylindrical shape, a helical shape, an ovoid shape, or any combination thereof. In some examples, the springs 325 may be arranged based on a pin count of the package 305, a size of the interface 320, a layout of the interface 320, a quantity of metal pads 365. or any combination thereof.

In some examples, the memory system 300 may include a set of latches 355 configured to secure the package 305 in a fixed position relative to the PCB 310. In some examples, the latches 355 may include an insulating material. That is, the set of springs 325 may provide an electrical connection between the package 305 and the PCB 310, and the set of latches 355 may provide a mechanical connection between the package 305 and the PCB 310.

In some examples, the memory system 300 may be configured to perform one or more memory operations. For example, the memory system 300 may receive (e.g., at the controller 360 of the PCB 310) an activation command to open a set of memory cells of the memory device 315 for an access operation (e.g., a write command, a read command, a program command, or any combination thereof). After receiving the activation command, the memory system 300 may receive an access command, and the memory device 315 (e.g., a memory cell of the memory device 315) may be accessed via the interface 320 and the springs 325. In some examples, the memory system 300 may receive a precharge command to close the set of memory cells after accessing the memory device 315. The latches 355 and the springs 325 may improve reliability of these memory operations by reducing defects (e.g., cracks in solder joints, cracks in copper traces between components of the package 305 or the PCB 310, damage during testing of the memory system 300, warpage of the package 305 or the PCB 310, among other examples) in the memory system 300.

In some examples, the components of the memory system 300, as illustrated in FIG. 3, may not be to scale or may include artifacts to illustrate the features of the components. For example, FIG. 3 includes a gap between the package 305 and the PCB 310 to illustrate the placement of the springs 325. In some examples, there may not be a gap between the package 305 and the PCB 310. Additionally, or alternatively, the springs 325 may have various sizes relative to the package 305 and the PCB 310. For example, the interface 320 may be configured to communicate via a relatively large quantity of springs 325 (e.g., micro springs). In some examples, the latches 355 may include additional structures or be more complex than those illustrated in FIG. 3.

Figure 4A:
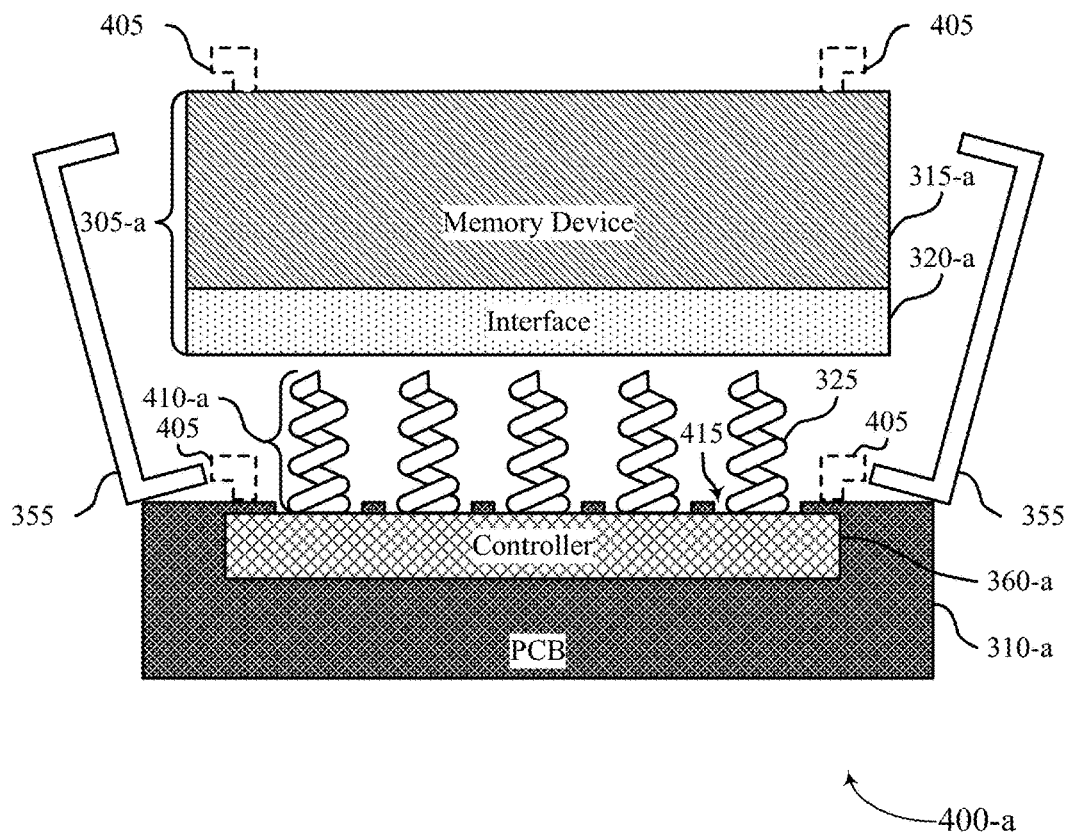
FIGS. 4A and 4B illustrate examples of memory systems that support connection designs for memory systems in accordance with examples as disclosed herein.
Figure 4B:
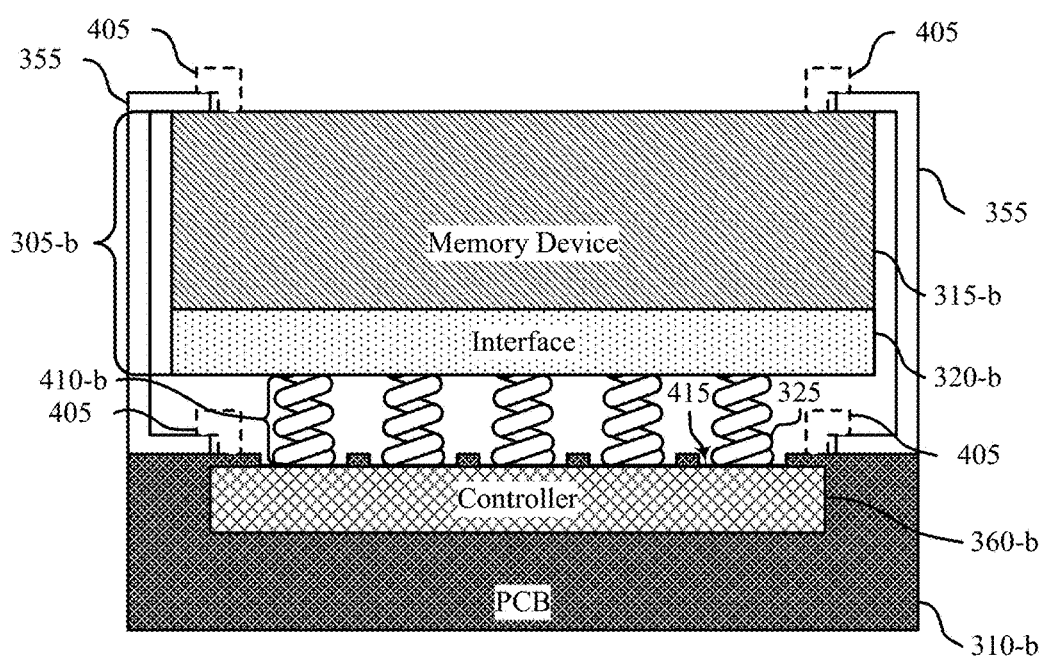

FIGS. 4A and 4B illustrate examples of memory systems 400 that support connection designs for memory systems in accordance with examples as disclosed herein. In some examples, the memory systems 400 may include one or more aspects of the memory system 300 as described with reference to FIG. 3.

Each memory system 400 may include a package 305 and a PCB 310. The package 305 may include a memory device 315, which may include or be an example of one or more memory dies as described with reference to FIGS. 1 and 2. In some examples, the package 305 may further include one or more components for enabling memory operations. For example, the package 305 may include an interface 320 (e.g., a set of TSVs) for communicating with a controller 360 (e.g., a device memory controller or an external memory controller of a host device) of the PCB 310. The interface 320 may be configured to communicate (electronically) with the controller 360 via a set of springs 325. Each spring 325 may configured to deform based at least in part on a shape of the package 305, a shape of the PCB 310, or both. In some examples, each spring 325 may be located in a recess 415 of the PCB 310.

In some examples, each memory system 400 may include a set of latches 355 configured to secure the package 305 in a fixed position relative to the PCB 310. Each memory system may include one or more connection structures 405 (e.g., on the package 305, on the PCB 310, or both), where each connection structure 405 may be configured to receive or secure a latch 355. In some examples, the latches 355 may include an insulating material. That is, the set of springs 325 may be configured to provide an electrical connection between the package 305 and the PCB 310, and the set of latches 355 may be configured to provide a mechanical connection between the package 305 and the PCB 310.

As illustrated in FIG. 4A, a memory system 400-a may be in an "open" (e.g., disconnected) state, where a package 305-a may not be connected to a PCB 310-a. That is, the latches 355 may be open or otherwise not positioned to secure the package 305-a in a fixed position relative to the PCB 310-a. Additionally, a memory device 315-a of the package 305-a may not be coupled with a controller 360-a of the PCB 310-a. For example, an interface 320-a may be disconnected from a set of springs 325. Each spring 325 of the PCB 310-a may have a height 410-a, where the height 410-a may represent a "relaxed" position (e.g., not stretched, not compressed, not deformed) of the springs 325. That is, in the "open" state of the memory system 400-a, the latches 355 may not provide a mechanical connection between the package 305-a and the PCB 310-a, and the springs 325 may not provide an electrical connection between the package 305-a and the PCB 310-a.

As illustrated in FIG. 4B, a memory system 400-b may be in a "closed" (e.g., connected) state, where a package 305-b may be connected to a PCB 310-b. That is, the latches 355 may be closed or otherwise positioned (e.g., secured in connection structures 405) to secure the package 305-b in a fixed position relative to the PCB 310-b. Additionally, a memory device 315-b of the package 305-b may be coupled with a controller 360-b of the PCB 310-b. For example, an interface 320-b may be coupled with a set of springs 325. Each spring 325 of the PCB 310-b may have a height 410-b, where the height 410-b may represent a compressed (e.g., deformed) position of the springs 325. That is, in the "closed" state of the memory system 400-b, the latches 355 may provide a mechanical connection between the package 305-b and the PCB 310-b, and the springs 325 may provide an electrical connection between the package 305-b and the PCB 310-b.

In some examples, the components of the memory systems 400, as illustrated in FIGS. 4A and 4B, may not be to scale or may include artifacts to illustrate the features of the components. For example, FIG. 4B includes a gap between the package 305-b and the PCB 310-b to illustrate the placement of the springs 325. In some examples, there may not be a gap between the package 305-b and the PCB 310-b in the "closed" state of the memory system 400-b. Additionally, or alternatively, the springs 325 may have various sizes relative to the package 305-b and the PCB 310-b. For example, the interface 320-b may be configured to communicate via a relatively large quantity of springs 325 (e.g., micro springs). In some examples, the latches 355, the connection structures 405, or both, may include additional structures or be more complex than those illustrated in FIGS. 4A and 4B.

Figure 5A:
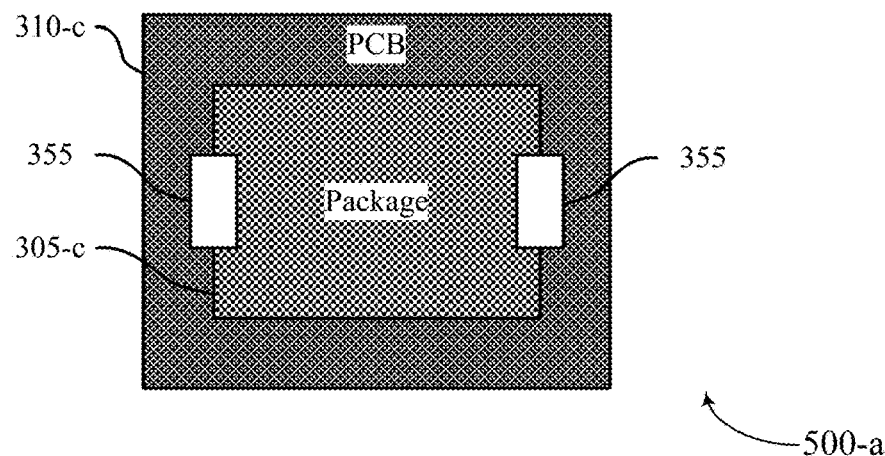
FIGS. 5A through 5C illustrate examples of memory systems that support connection designs for memory systems in accordance with examples as disclosed herein.
Figure 5B:
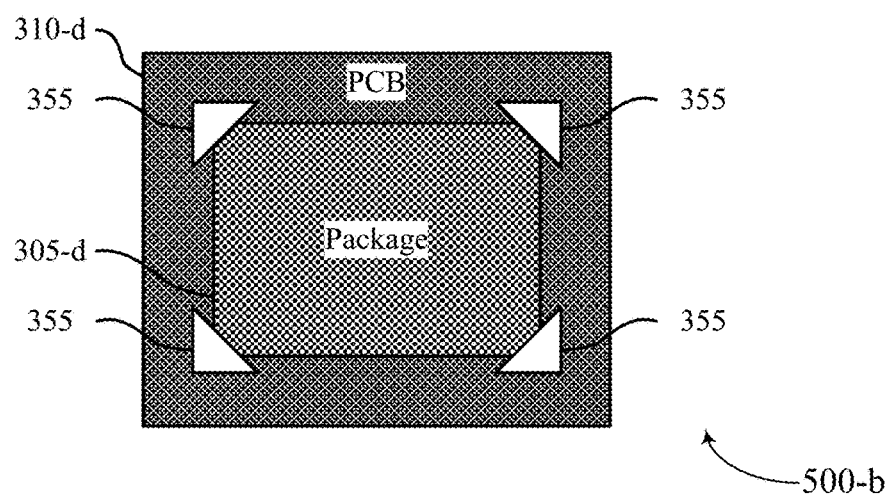
Figure 5C:
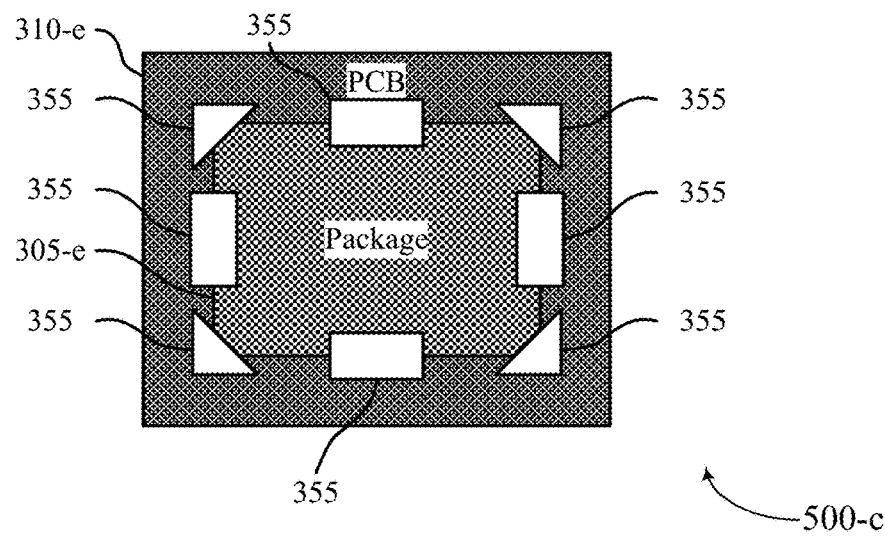

FIGS. 5A through 5C illustrate examples of memory systems 500 that support connection designs for memory systems in accordance with examples as disclosed herein. In some examples, the memory systems 500 may include one or more aspects of the memory system 300 as described with reference to FIG. 3.

Each memory system 500 may include a package 305 and a PCB 310. In some examples, each memory system 500 may include a set of latches 355 configured to secure the package 305 in a fixed position relative to the PCB 310. Each latch 355 may include an insulating material. For example, the insulating material may include a metal, a plastic, or both, where the insulating material may be selected based on a thermal range associated with operating the memory system 500.

In a first example illustrated in FIG. 5A, a memory system 500-a may include two latches 355 configured to secure edges of a package 305-c in a fixed position relative to a PCB 310-c. In a second example illustrated in FIG. 5B, a memory system 500-b may include four latches 355 configured to secure corners of a package 305-d in a fixed position relative to a PCB 310-d. In a third example illustrated in FIG. 5C, a memory system 500-c may include four latches 355 configured to secure corners of a package 305-e in a fixed position relative to a PCB 310-e and four latches 355 configured to secure edges of a package 305-e in a fixed position relative to a PCB 310-e.

In some examples, the latches 355 may include additional structures or be more complex than those illustrated in FIGS. 5A-5C. For example, a shape of each latch 355, or a layout of the latches 355, or both, may vary. In some examples, the shape of each latch 355, the layout of the latches 355, or both, may be based on a shape of a package 305 or a shape of a PCB 310.

Figure 6:
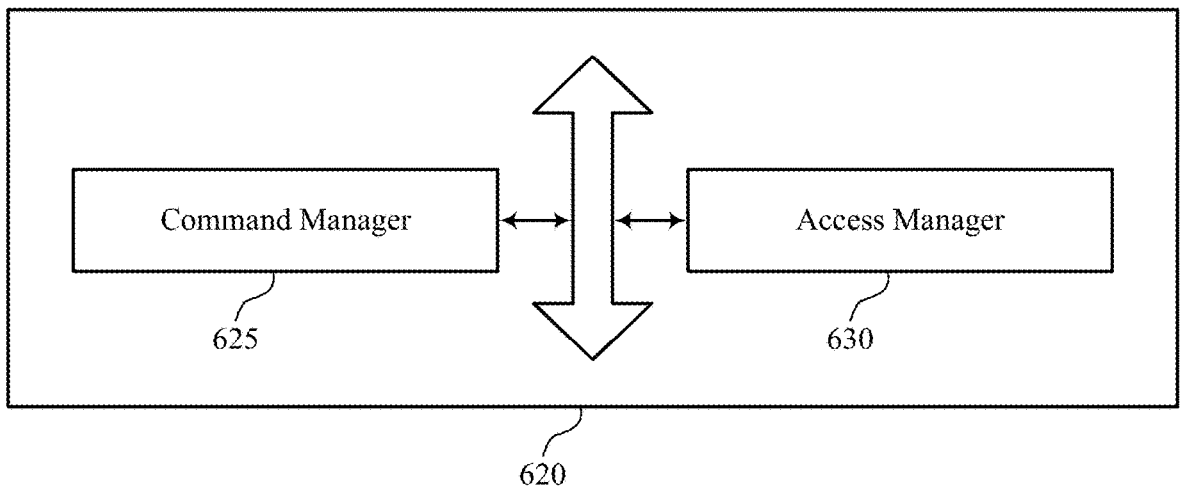
FIG. 6 shows a block diagram of a memory system that supports connection designs for memory systems in accordance with examples as disclosed herein.

FIG. 6 shows a block diagram 600 of a memory system 620 that supports connection designs for memory systems in accordance with examples as disclosed herein. The memory system 620 may be an example of aspects of a memory system as described with reference to FIGS. 1 through 3, 4A, 4B, and 5A-5C. The memory system 620, or various components thereof, may be an example of means for performing various aspects of connection designs for memory systems as described herein. For example, the memory system 620 may include a command manager 625 an access manager 630, or any combination thereof. Each of these components may communicate, directly or indirectly, with one another (e.g., via one or more buses).

The command manager 625 may be configured as or otherwise support a means for receiving an activation command to open a set of memory cells of a memory device for access operations, the activation command received at a controller that is coupled with the memory device via a set of springs coupled with a first interface of a package that includes the memory device. In some examples, the command manager 625 may be configured as or otherwise support a means for receiving, at the controller, an access command after receiving the activation command. The access manager 630 may be configured as or otherwise support a means for accessing, via the set of springs and the first interface, a memory cell of the set of memory cells in response to the access command.

In some examples, the first interface of the package includes a set of metal pads, each metal pad of the set of metal pads coupled with a spring of the set of springs.

In some examples, each spring of the set of springs has a spring size that is based at least in part on a pad size of each metal pad of the set of metal pads.

In some examples, the set of springs are arranged based at least in part on a pin count of the package, a size of the first interface, or both.

In some examples, each spring of the set of springs includes a conductive material that is based at least in part on a thermal range associated with operating the memory device.

In some examples, the command manager 625 may be configured as or otherwise support a means for receiving a precharge command to close the set of memory cells after accessing the memory cell.

In some examples, the access command includes a read command, a write command, a program command, or any combination thereof.

Figure 7:
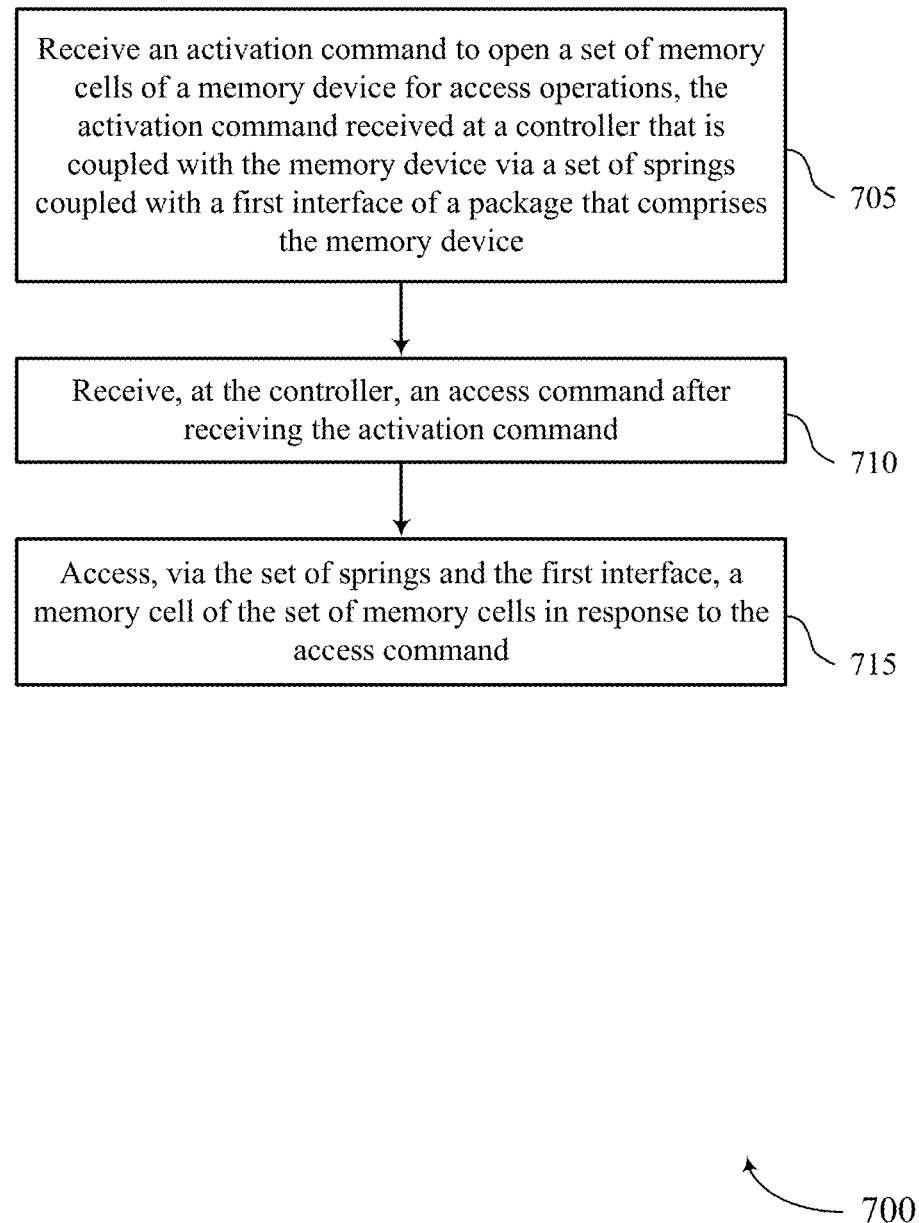
FIG. 7 shows a flowchart illustrating a method or methods that support connection designs for memory systems in accordance with examples as disclosed herein.

FIG. 7 shows a flowchart illustrating a method 700 that supports connection designs for memory systems in accordance with examples as disclosed herein. The operations of method 700 may be implemented by a memory system or its components as described herein. For example, the operations of method 700 may be performed by a memory system as described with reference to FIGS. 1 through 3, 4A, 4B, 5A-5C, and 6. In some examples, a memory system may execute a set of instructions to control the functional elements of the device to perform the described functions. Additionally, or alternatively, the memory system may perform aspects of the described functions using special-purpose hardware.

At 705, the method may include receiving an activation command to open a set of memory cells of a memory device for access operations, the activation command received at a controller that is coupled with the memory device via a set of springs coupled with a first interface of a package that includes the memory device. The operations of 705 may be performed in accordance with examples as disclosed herein. In some examples, aspects of the operations of 705 may be performed by a command manager 625 as described with reference to FIG. 6.

At 710, the method may include receiving, at the controller, an access command after receiving the activation command. The operations of 710 may be performed in accordance with examples as disclosed herein. In some examples, aspects of the operations of 710 may be performed by a command manager 625 as described with reference to FIG. 6.

At 715, the method may include accessing, via the set of springs and the first interface, a memory cell of the set of memory cells in response to the access command. The operations of 715 may be performed in accordance with examples as disclosed herein. In some examples, aspects of the operations of 715 may be performed by an access manager 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving an activation command to open a set of memory cells of a memory device for access operations, the activation command received at a controller that is coupled with the memory device via a set of springs coupled with a first interface of a package that includes the memory device; receiving, at the controller, an access command after receiving the activation command; and accessing, via the set of springs and the first interface, a memory cell of the set of memory cells in response to the access command.

Aspect 2: The method, apparatus, or non-transitory computer-readable medium of aspect 1, where the first interface of the package includes a set of metal pads, each metal pad of the set of metal pads coupled with a spring of the set of springs.

Aspect 3: The method, apparatus, or non-transitory computer-readable medium of aspect 2, where each spring of the set of springs has a spring size that is based at least in part on a pad size of each metal pad of the set of metal pads.

Aspect 4: The method, apparatus, or non-transitory computer-readable medium of any of aspects 1 through 3, where the set of springs are arranged based at least in part on a pin count of the package, a size of the first interface, or both.

Aspect 5: The method, apparatus, or non-transitory computer-readable medium of any of aspects 1 through 4, where each spring of the set of springs includes a conductive material that is based at least in part on a thermal range associated with operating the memory device.

Aspect 6: The method, apparatus, or non-transitory computer-readable medium of any of aspects 1 through 5, further including operations, features, circuitry, logic, means, or instructions, or any combination thereof for receiving a precharge command to close the set of memory cells after accessing the memory cell.

Aspect 7: The method, apparatus, or non-transitory computer-readable medium of any of aspects 1 through 6, where the access command includes a read command, a write command, a program command, or any combination thereof.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: An apparatus, including: a package including a memory device and a first interface; a printed circuit board including a set of springs coupled with the first interface of the package; and a set of latches configured to secure the package in a fixed position relative to the printed circuit board.

Aspect 9: The apparatus of aspect 8, where the printed circuit board further includes: a controller coupled with the set of springs and configured to communicate with the memory device, where the set of springs are configured to communicate signals between the package and the printed circuit board.

Aspect 10: The apparatus of any of aspects 8 through 9, where the printed circuit board further includes: a set of recesses, each spring of the set of springs located in a recess of the set of recesses.

Aspect 11: The apparatus of any of aspects 8 through 10, where the package further includes: a set of connection structures, each connection structure of the set of connection structures configured to receive a latch of the set of latches.

Aspect 12: The apparatus of any of aspects 8 through 11, where the printed circuit board further includes: a set of connection structures, each connection structure of the set of connection structures configured to receive a latch of the set of latches.

Aspect 13: The apparatus of any of aspects 8 through 12, where each latch of the set of latches is configured to secure an edge of the package, a corner of the package, or both in the fixed position relative to the printed circuit board.

Aspect 14: The apparatus of any of aspects 8 through 13, where the first interface of the package includes a set of metal pads, each metal pad of the set of metal pads coupled with a spring of the set of springs.

Aspect 15: The apparatus of aspect 14, where each spring of the set of springs has a spring size that is based at least in part on a pad size of each metal pad of the set of metal pads.

Aspect 16: The apparatus of any of aspects 8 through 15, where the set of springs are arranged based at least in part on a pin count of the first interface of the package, a layout of the first interface of the package, a size of the first interface, or both.

Aspect 17: The apparatus of any of aspects 8 through 16, where each spring of the set of springs includes a material that is configured to deform based at least in part on a deformation of the package, a deformation of the printed circuit board, or both.

Aspect 18: The apparatus of any of aspects 8 through 17, where each spring of the set of springs includes a conductive material that is based at least in part on a thermal range associated with operating the memory device.

Aspect 19: The apparatus of aspect 18, where the conductive material includes copper, silver, tin, or any combination thereof.

Aspect 20: The apparatus of any of aspects 8 through 19, where each latch of the set of latches includes an insulating material.

An apparatus is described. The following provides an overview of aspects of the apparatus as described herein:

Aspect 21: An apparatus, including: a package including a memory device, the package including a first interface; and a printed circuit board including a controller and a set of springs coupled with the first interface of the package, where the controller is configured to cause the apparatus to: receive an activation command to open a set of memory cells of the memory device for access operations; receive an access command after receiving the activation command; and access, via the set of springs and the first interface, a memory cell of the set of memory cells in response to the access command.

Aspect 22: The apparatus of aspect 21, where the first interface of the package includes a set of metal pads, each metal pad of the set of metal pads coupled with a spring of the set of springs.

Aspect 23: The apparatus of aspect 22, where each spring of the set of springs has a spring size that is based at least in part on a pad size of each metal pad of the set of metal pads.

Aspect 24: The apparatus of any of aspects 21 through 23, where the set of springs are arranged based at least in part on a pin count of the package, a size of the first interface, or both.

Aspect 25: The apparatus of any of aspects 21 through 24, where each spring of the set of springs includes a conductive material that is based at least in part on a thermal range associated with operating the memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a package comprising a memory device and a first interface;
a printed circuit board comprising a set of springs coupled with the first interface of the package, wherein the printed circuit board further comprises a controller coupled with the set of springs and configured to communicate with the memory device, wherein the set of springs are configured to communicate signals between the package and the controller; and
a set of latches configured to secure the package in a fixed position relative to the printed circuit board.

2. The apparatus of claim 1, wherein the printed circuit board further comprises:
a set of recesses, each spring of the set of springs located in a recess of the set of recesses.

3. The apparatus of claim 1, wherein the package further comprises:
a set of connection structures, each connection structure of the set of connection structures configured to receive a latch of the set of latches.

4. The apparatus of claim 1, wherein each latch of the set of latches is configured to secure an edge of the package, a corner of the package, or both in the fixed position relative to the printed circuit board.

5. The apparatus of claim 1, wherein the first interface of the package comprises a set of metal pads, each metal pad of the set of metal pads coupled with a spring of the set of springs.

6. The apparatus of claim 5, wherein each spring of the set of springs has a spring size that is based at least in part on a pad size of each metal pad of the set of metal pads.

7. The apparatus of claim 1, wherein the set of springs are arranged based at least in part on a pin count of the first interface of the package, a layout of the first interface of the package, a size of the first interface, or both.

8. The apparatus of claim 1, wherein each spring of the set of springs comprises a material that is configured to deform based at least in part on a deformation of the package, a deformation of the printed circuit board, or both.

9. The apparatus of claim 1, wherein each spring of the set of springs comprises a conductive material that is based at least in part on a thermal range associated with operating the memory device.

10. The apparatus of claim 9, wherein the conductive material comprises copper, silver, tin, or any combination thereof.

11. The apparatus of claim 1, wherein each latch of the set of latches comprises an insulating material.

12. An apparatus, comprising:
a package comprising a memory device and a first interface;
a printed circuit board comprising a set of springs coupled with the first interface of the package; and
a set of latches configured to secure the package in a fixed position relative to the printed circuit board,
wherein the printed circuit board further comprises a set of connection structures, each connection structure of the set of connection structures configured to receive a latch of the set of latches.

13. An apparatus, comprising:
a package comprising a memory device, the package including a first interface; and
a printed circuit board comprising a controller and a set of springs coupled with the first interface of the package, wherein the controller is configured to cause the apparatus to:
receive an activation command to open a set of memory cells of the memory device for access operations;
receive an access command after receiving the activation command; and
access, via the set of springs and the first interface, a memory cell of the set of memory cells in response to the access command.

14. The apparatus of claim 13, wherein the first interface of the package comprises a set of metal pads, each metal pad of the set of metal pads coupled with a spring of the set of springs.

15. The apparatus of claim 14, wherein each spring of the set of springs has a spring size that is based at least in part on a pad size of each metal pad of the set of metal pads.

16. The apparatus of claim 13, wherein the set of springs are arranged based at least in part on a pin count of the package, a size of the first interface, or both.

17. The apparatus of claim 13, wherein each spring of the set of springs comprises a conductive material that is based at least in part on a thermal range associated with operating the memory device.

* * * * *